United States Patent
Wagner (10) Patent No.: US 12,216,002 B2
(45) Date of Patent: Feb. 4, 2025

(54) DUAL-AMPLIFIER CIRCUIT FOR OPTICAL SIGNALS

(71) Applicant: VIAVI SOLUTIONS INC., San Jose, CA (US)

(72) Inventor: Christopher Russell Wagner, Kanata (CA)

(73) Assignee: VIAVI SOLUTIONS INC., Chandler, AZ (US)

( * ) Notice: Subject to any disclaimer, the term of this patent is extended or adjusted under 35 U.S.C. 154(b) by 389 days.

(21) Appl. No.: 17/716,585

(22) Filed: Apr. 8, 2022

(65) Prior Publication Data

US 2023/0324219 A1  Oct. 12, 2023

(51) Int. Cl.
  *G01J 1/44* (2006.01)
  *H03F 3/45* (2006.01)
  *H03M 1/12* (2006.01)

(52) U.S. Cl.
  CPC ............ *G01J 1/44* (2013.01); *H03F 3/45475* (2013.01); *H03M 1/124* (2013.01); *G01J 2001/4406* (2013.01); *G01J 2001/446* (2013.01)

(58) Field of Classification Search
  CPC ................ G01J 1/44; G01J 2001/4406; G01J 2001/446; H03F 3/45475; H03F 2200/261; H03F 3/087; H03M 1/124
  See application file for complete search history.

(56) References Cited

U.S. PATENT DOCUMENTS

| | | | | |
|---|---|---|---|---|
| 3,972,626 A | * | 8/1976 | Laskowsi ................ | G01J 1/44 250/214 P |
| 2003/0063354 A1 | * | 4/2003 | Davidson ............... | G01M 11/33 398/202 |
| 2003/0222206 A1 | * | 12/2003 | Azary .................. | G01C 15/006 250/214 AG |

* cited by examiner

Primary Examiner — Thanh Luu
Assistant Examiner — Monica T Taba
(74) Attorney, Agent, or Firm — Mannava & Kang, P.C.

(57) ABSTRACT

A system for amplification of optical signals for optical measurement instrumentation is disclosed. The system may include a first logarithmic amplifier circuit in a first amplification path, and a linear amplifier circuit and a second logarithmic amplifier circuit coupled in series in a second amplification path. The first and second amplification paths may receive an input signal from a photodiode and provide amplified signals, in parallel, to a selection circuit, which may select one of the outputs of the first and second amplification paths based on one or two power thresholds. The selection circuit may then provide the selected output to a measurement circuit or device. In some examples, the system may also include a sampling circuit to sample the outputs and an analog-digital conversion circuit to digitize the outputs before selection. The power threshold(s) may be determined based on a saturation level of the linear amplifier circuit.

20 Claims, 7 Drawing Sheets

DUAL-AMPLIFIER CIRCUIT FOR OPTICAL SIGNALS

TECHNICAL FIELD

This patent application is directed to optical measurement instrumentation, and more specifically, a dual-amplifier circuit for optical signals with enhanced speed and dynamic range.

BACKGROUND

Optical measurement instrumentation, such as optical spectrometers or optical spectrum analyzers (OSAs), optical power meters, fiberoptic monitoring devices, and similar ones play an important role in telecommunication and other optical technologies. Optical measurement instrumentation may include photodetection amplification circuits. Photodetection amplification circuits may include linear gain-switched and logarithmic-gain amplifier circuits, both of which may have challenges in detecting low power, high frequency optical signals.

BRIEF DESCRIPTION OF DRAWINGS

Features of the present disclosure are illustrated by way of example and not limited in the following Figure(s), in which like numerals indicate like elements, in which.

DETAILED DESCRIPTION

For simplicity and illustrative purposes, the present disclosure is described by referring mainly to examples and embodiments thereof. In the following description, numerous specific details are set forth in order to provide a thorough understanding of the present disclosure. It will be readily apparent, however, that the present disclosure may be practiced without limitation to these specific details. In other instances, some methods and structures readily understood by one of ordinary skill in the art have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

As mentioned herein, some photodetection devices may include linear gain-switched amplification following a photodetector, for example, a photodiode. When detected optical power levels are low, a linear gain-switched amplifier may respond by switching to a highest gain range of the linear amplifier circuit. As the output signal rises, so does the output amplified photo-current, until the circuit reaches the maximum range the gain-stage. When this threshold is reached, the linear amplifier circuit may dynamically switch to a lower gain range. In addition to the amplification limit of the linear amplifier circuit, fast optical events traversing the switching threshold may be hidden by the circuit switching. Furthermore, high slew-rate changes spanning multiple gain stages may present additional challenges in detecting fast signal transitions, for example in finely resolved spectral features in an optical spectrum analyzer (OSA).

Other photodetection devices may include logarithmic amplifier-based amplification, which may have a single gain-stage covering an entire input signal span from very low light levels to very high light levels. In addition to logarithmic amplifier circuits being able to obviate a need for gain switching and be capable of high dynamic ranges (e.g., more than 80 dB), such circuits have a detection bandwidth, or speed, that may change depending on optical power level. At high optical power levels, a gain of the logarithmic amplifier circuit may be set low, and a resultant photodetection circuit may have a high detection bandwidth (e.g., higher than 300 kHz). Thus, high-frequency changes in the detected photocurrent may be faithfully amplified, with low distortion. However, when operating with very low light levels of detected photocurrent, the bandwidth of the logarithmic amplifier circuit may be severely degraded, and high-speed changes of the photocurrent may not be amplified faithfully at high-speed. The amplified output of the logarithmic amplifier circuit may suffer from distortion and may be slow to respond.

In some examples of the present disclosure, the challenges of conventional photodetection amplifiers are mitigated by providing a dual-path amplification with selection between the paths based on an input optical power threshold. One amplification path may include a linear amplifier circuit, for example, an operational amplifier circuit, coupled in series to a logarithmic amplifier circuit. A parallel amplification path may include a separate logarithmic amplifier circuit. A selection circuit may select outputs of either amplification path depending on a power threshold resulting in faithful amplification of the input signal across the frequency band even for low optical power levels. In some examples, the selection may occur post analog-digital conversion of sampled outputs of the amplification paths.

Figure 1:
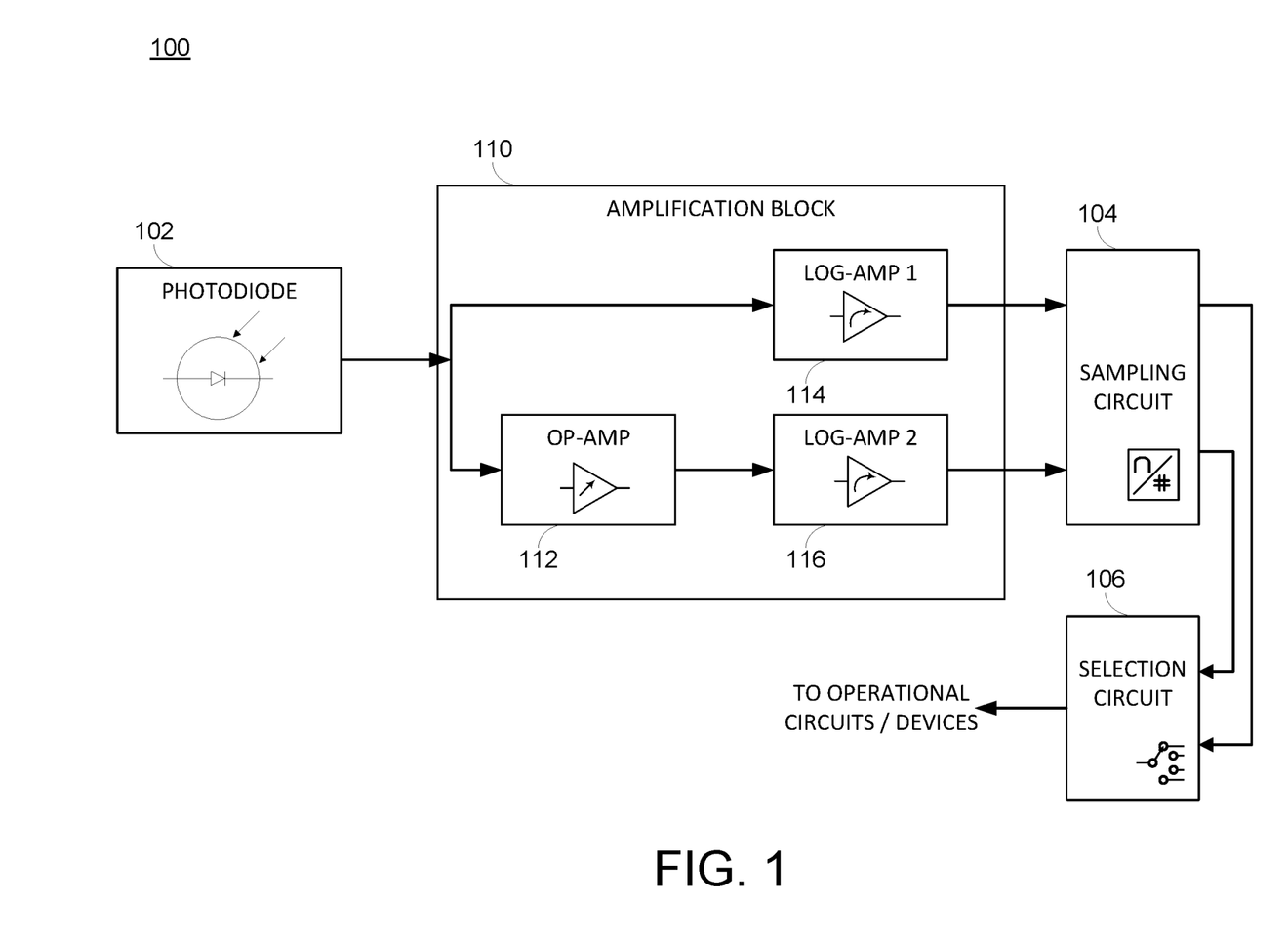
FIG. 1 illustrates a block diagram 100 of a detection portion of an optical measurement device, according to an example.

FIG. 1 illustrates a block diagram 100 of a detection portion of an optical measurement device, according to an example. In some examples, the block diagram 100 may depict a photodiode 102 coupled to an amplification block 110, which may include a first amplification path including logarithmic amplifier circuit 114 and a second amplification path including an operational amplifier circuit 112 (linear amplification) and logarithmic amplifier circuit 116. Outputs of the amplification paths may be provided to a sampling circuit 104, where the outputs may be converted from analog to digital. The digital outputs may be provided to a selection circuit 106, which may select one of the amplification path outputs depending on a power threshold. An output of the selection circuit may then be provided to operational circuits and devices of an optical measurement system such as an optical power meter, an optical spectrum analyzer (OSA), a fiberoptic monitoring system, or similar ones.

It should be appreciated that photodiode 102 may be formed as a p-n junction or a p-i-n (PIN) structure, where current is produced in response to illumination of a diode surface. When a photon of sufficient energy is absorbed by the diode, it creates an electron—hole pair (inner photoelectric effect). If the absorption occurs in the junction's depletion region, the carriers may be swept from the junction by the built-in electric field of the depletion region. Thus, holes may move toward the anode, and electrons toward the cathode, thereby creating a photocurrent signal. Photodiode 102 may also include an optical filter, an optical lens, a fiberoptic coupling window, or similar additional features. As photocurrents tend to be low-level currents, one or more stages of amplification may be implemented depending on an instrument type.

Accordingly, the photocurrent signal from the photodiode 102 may be amplified by the amplification block 110, in some examples. A first amplification path of the amplification block 110 may include the first logarithmic amplifier circuit 114. The second amplification path may include the operational amplifier circuit 112 and the second logarithmic amplifier circuit 116 coupled in series. The operational amplifier circuit 112 is an implementation of a linear amplifier. As such, the operational amplifier circuit 112 may provide switchable gain allowing low levels of input signal (photocurrent signal) to be amplified faithfully. Faithful amplification refers to a circuit performance, where an amplified output signal follows a shape of an input signal. However, a dynamic range of the operational amplifier circuit 112 may be limited (e.g., about 30 dB) resulting in degradation (i.e., no amplification) at higher levels of the input signal. The first logarithmic amplifier circuit 114 and the second logarithmic amplifier circuit 116 may have a larger dynamic range (e.g., about 80 dB or more), but a standalone logarithmic amplifier circuit may not be able to amplify the input signal faithfully at low levels resulting in degradation in such regions.

In some examples, the logarithmic amplifier circuit 114 forming the first amplification path may provide faithful amplification for higher level input signals, that is when a power of the input signal is above a particular threshold. The combination of the operational amplifier circuit 112 and the logarithmic amplifier circuit 116 forming the second amplification path may provide relatively faithful amplification for lower-level input signals, while cutting off the signal at high power levels. The first and second amplification paths may amplify the input signal in parallel. The sampling circuit 104 may sample the outputs of the first and second amplification paths and perform analog-digital conversion. Subsequently, the selection circuit 106, which may be implemented as a field programmable gate array (FPGA) or a similar signal processing circuit, may select one of the digitized output signals based on the power level.

Accordingly, the combination of the selected outputs may provide a faithfully amplified signal based on the photocurrent signal from the photodiode 102 with a wide dynamic range that allows low levels of the photocurrent signal to be amplified (and digitized) along with higher levels. The selected output signal may be provided to operational circuits and/or devices in an optical measurement device such as an optical spectrum analyzer (OSA), a swept wavelength measurement system, an optical power meter, a high-density optical power meter, a fiberoptic monitoring system, or similar ones.

In some examples, the sampling circuit 104 may include two sub-circuits, one for sampling and one for analog-digital conversion. The analog-digital conversion sub-circuit may convert respective sampled outputs of the first and second amplification paths (first and second logarithmic amplifier circuits) to a first digital signal and a second digital signal. The selection circuit 106 may then select between the first and second digital signals. Yet, in other examples, the analog-digital conversion may not be performed, and the selection may be performed on analog output signals of the first and second amplification paths.

Figure 2:
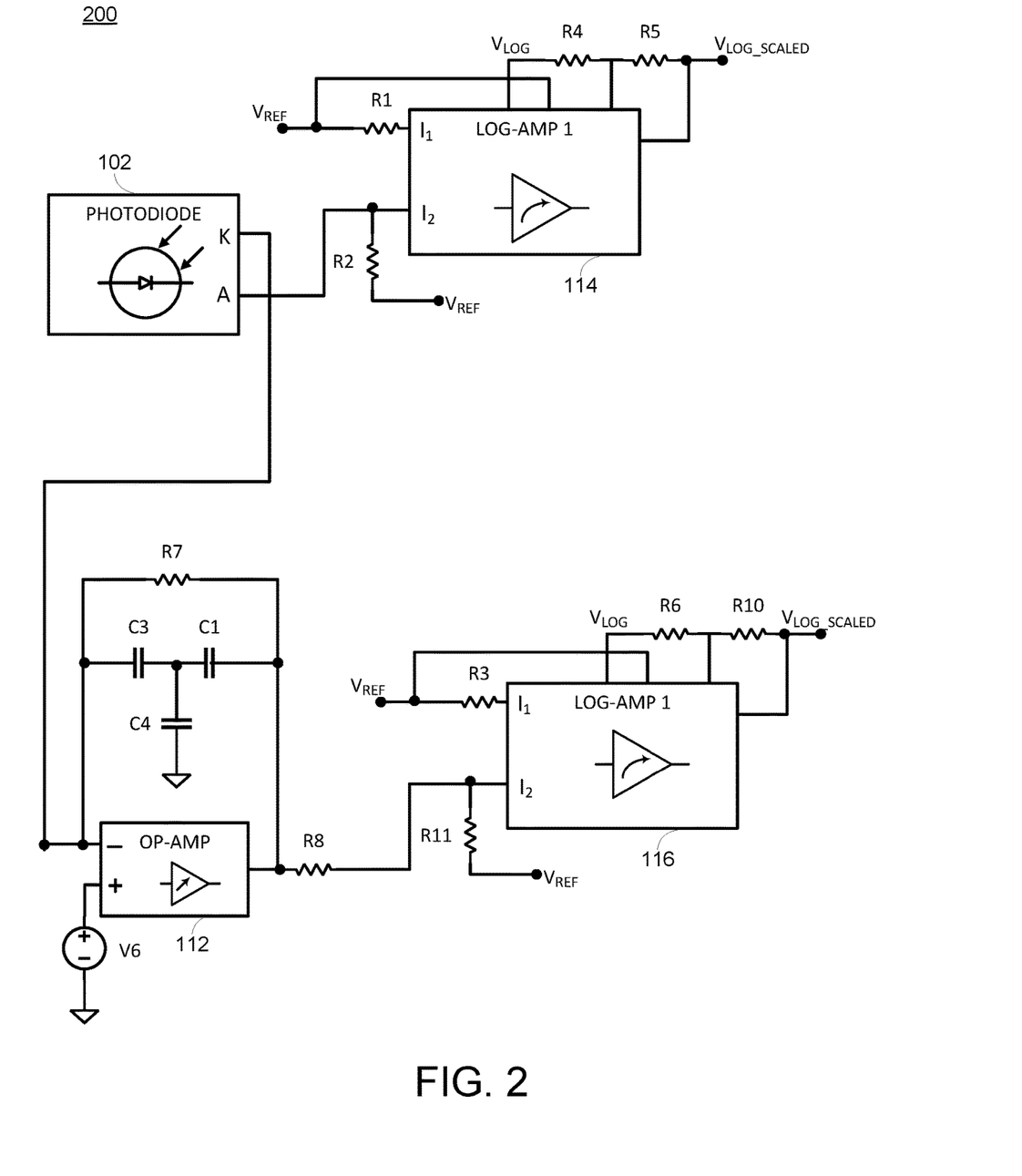
FIG. 2 illustrates a schematic diagram 200 of an amplification portion of an optical measurement device, according to an example.

FIG. 2 illustrates a schematic diagram 200 of an amplification portion of an optical measurement device, according to an example. As shown in diagram 200, a first amplification path may include a logarithmic amplifier circuit 114, where an anode output A of a photodiode 102 is coupled to a second input 12 of the logarithmic amplifier circuit 114 in parallel with a reference voltage VREF through a resistor R2. A first input 11 of the logarithmic amplifier circuit 114 may be coupled to the reference voltage VREF through a resistor R1. A logarithmic voltage output VLOG of the logarithmic amplifier circuit 114 may be coupled through resistors R4 and R5 (coupled in series) to an output of one of the internal amplifiers of the logarithmic amplifier circuit 114 providing a scaled logarithmic output voltage VLOG_SCALED1. Resistors R4 and R5 may be selected to adjust a gain of the logarithmic amplifier circuit 114.

In some examples, a cathode output K of the photodiode 102 may be coupled to a negative input of the operational amplifier circuit 112. A positive input of the operational amplifier circuit 112 may be coupled to a DC voltage source V6 to apply a bias voltage (if desired) to the photodiode, or to trim out offset voltages in the operational amplifier circuit 112. Resistors R8, coupled to an output of the operational amplifier circuit 112, and R7 coupled between the output and the negative input of the operational amplifier circuit 112, may provide gain adjustment for the operational amplifier circuit 112 along with capacitors C1, C3, and C4. Resistor R8 may provide the output of the operational amplifier circuit 112 to a second input of the logarithmic amplifier circuit 116 in parallel with the reference voltage VREF through resistor R11. As with the logarithmic amplifier circuit 114, a first input of the logarithmic amplifier circuit 116 may receive the reference voltage VREF through resistor R3. A logarithmic voltage output VLOG of the logarithmic amplifier circuit 116 may be coupled through resistors R6 and R10 (coupled in series) to an output of one of the internal amplifiers of the logarithmic amplifier circuit 116 providing a scaled logarithmic output voltage VLOG_SCALED2. Resistors R6 and R10 may be selected to adjust a gain of the logarithmic amplifier circuit 116.

As discussed in conjunction with FIG. 1, an output of the logarithmic amplifier circuit 114 (VLOG_SCALED1) and an output of the logarithmic amplifier circuit 116 (VLOG_SCALED2) may be sampled and digitized by a sampling circuit. A selector circuit may select between VLOG_SCALED1 and VLOG_SCALED2 based on a first power threshold and a second power level threshold (as the input signal is increasing to its peak and decreasing from its peak). The first and second power thresholds may have different values or have the same value and may be selected based, at least in part, on a saturation level of the operational amplifier circuit 112 (linear amplifier).

In an implementation example, various components of the circuits shown in diagram 200 may have following values. R1=R3=499 kΩ, R2=R11=20 MΩ, R4=R6=100 kΩ, R5=R10=24 kΩ, R7=3 MΩ, R8=1.16 kΩ; C1=C3=15 pF, C4=2 nF. Such an implementation example may have a dynamic range in excess of 80 dB and maintain a minimum bandwidth larger than 300 kHz over the entire power range.

While specific circuit configurations such as the arrangements of capacitors and resistors are shown in conjunction with the operational amplifier circuit 112 and logarithmic amplifier circuits 114, 116 in diagram 200, the illustrated configurations are not intended to be limiting. A dual-path amplification block may be implemented with other configurations and component values using the principles described herein.

Figure 3:
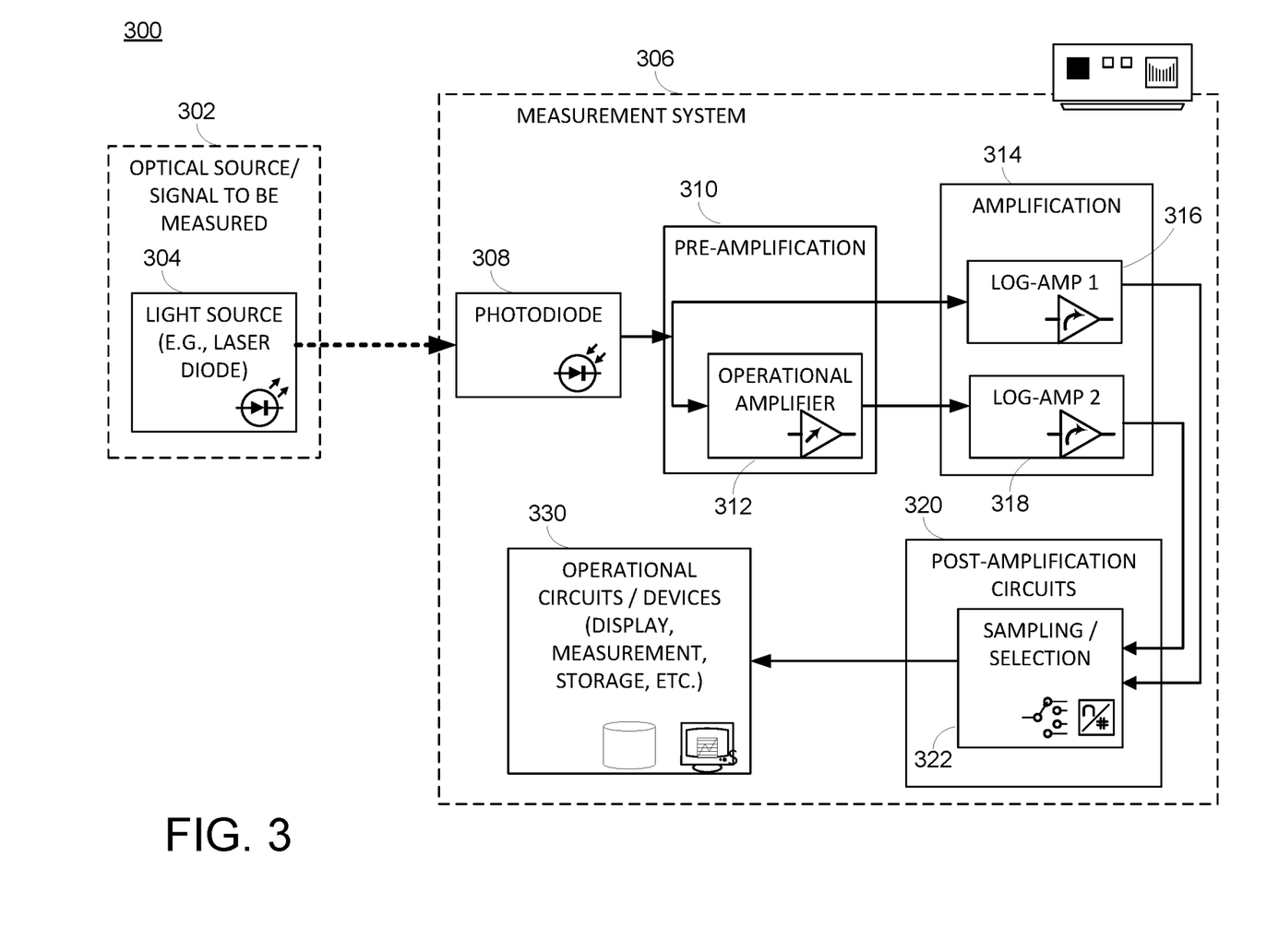
FIG. 3 illustrates a block diagram of an optical system 300 including an optical source or signal to be measured and a measurement system that may employ a linear amplifier and a logarithmic amplifier detector, according to an example.

FIG. 3 illustrates a block diagram of an optical system 300 including an optical source or signal to be measured and a measurement system that may employ a linear amplifier and a logarithmic amplifier detector, according to an example. Optical system 300 may include an optical source or signal to be measured 302 with a light source 304. The light from the optical source or signal to be measured 302 (or any other light) may be detected by a photodiode 308 of a measurement system 306. The measurement system 306 may be any optical measurement instrument including, but not limited to, an optical spectrum analyzer (OSA), a swept wavelength measurement system, an optical power meter, a high-density optical power meter, a fiberoptic monitoring system, and similar ones. The measurement system 306 may include a pre-amplification block 310 to receive the detected signal (photocurrent signal) from the photodiode 308. The pre-amplification block 310 may include, in some examples, an operational amplifier circuit 312.

In some examples, the pre-amplification block 310 for a dual-amplification path configuration may provide the detected signal directly and through the operational amplifier circuit 312 to an amplification block 314. The amplification block 314 may include two parallel logarithmic amplifier circuits 316 and 318. One of the logarithmic amplifier circuits (316) may receive the detected signal directly, while the other logarithmic amplifier circuit (318) may receive an output of the operational amplifier circuit 312. The dual outputs of the amplification block 314 may be provided to post-amplification circuits 320, which may include a sampling circuit, an analog-digital (ND) conversion circuit, and/or a selection circuit 322. The parallel amplification outputs may be sampled, converted to digital signals, and one of them selected based on a power level threshold of the input signal.

It should be appreciated that by selecting one of the amplification paths depending on the input signal power level, a faithful amplification of the input signal over a wide dynamic range (e.g., more than 80 dB) and with sufficient bandwidth to cover the input signal may be achieved. Thus, low power level optical signals with high frequencies may be detected and amplified with similar or same fidelity as higher power optical signals without any degradation in the amplified signal. An output of the post-amplification circuits 320 may be provided to operational circuits and devices 330 of the measurement system 306, which may include, but are not limited to, display devices, measurement circuits, storage devices, and comparable ones.

Some advantages and benefits of the systems and methods are readily apparent. For example, the systems and methods using one or more of the configurations described herein may allow for a wide dynamic range, large bandwidth amplification of optical signals. By selecting parallel, dual amplification outputs, faithful amplification across an entire range of input signal power levels may be achieved. Furthermore, discontinuities due to gain switching may also be avoided. Yet additional advantages may include reduced complexity and cost of optical measurement systems by reduced number of components (e.g., one operational amplifier and two logarithmic amplifiers) in place of more sophisticated, complex detection and amplification systems.

Figure 4A:
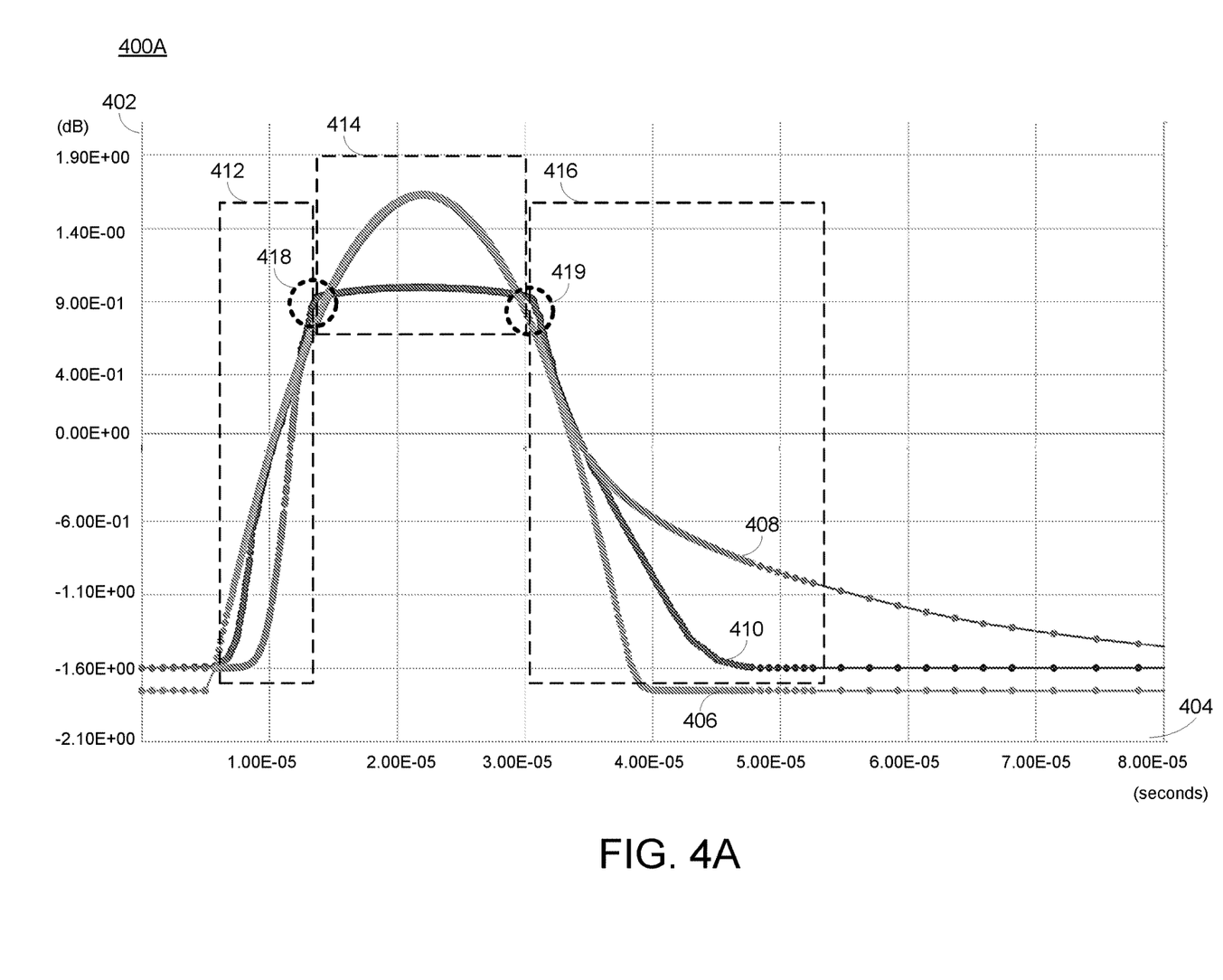
FIGS. 4A-4B illustrate graphs 400A and 400B representing input and output signals of a linear amplifier, a logarithmic amplifier, and a combination of thereof, according to an example.
Figure 4B:
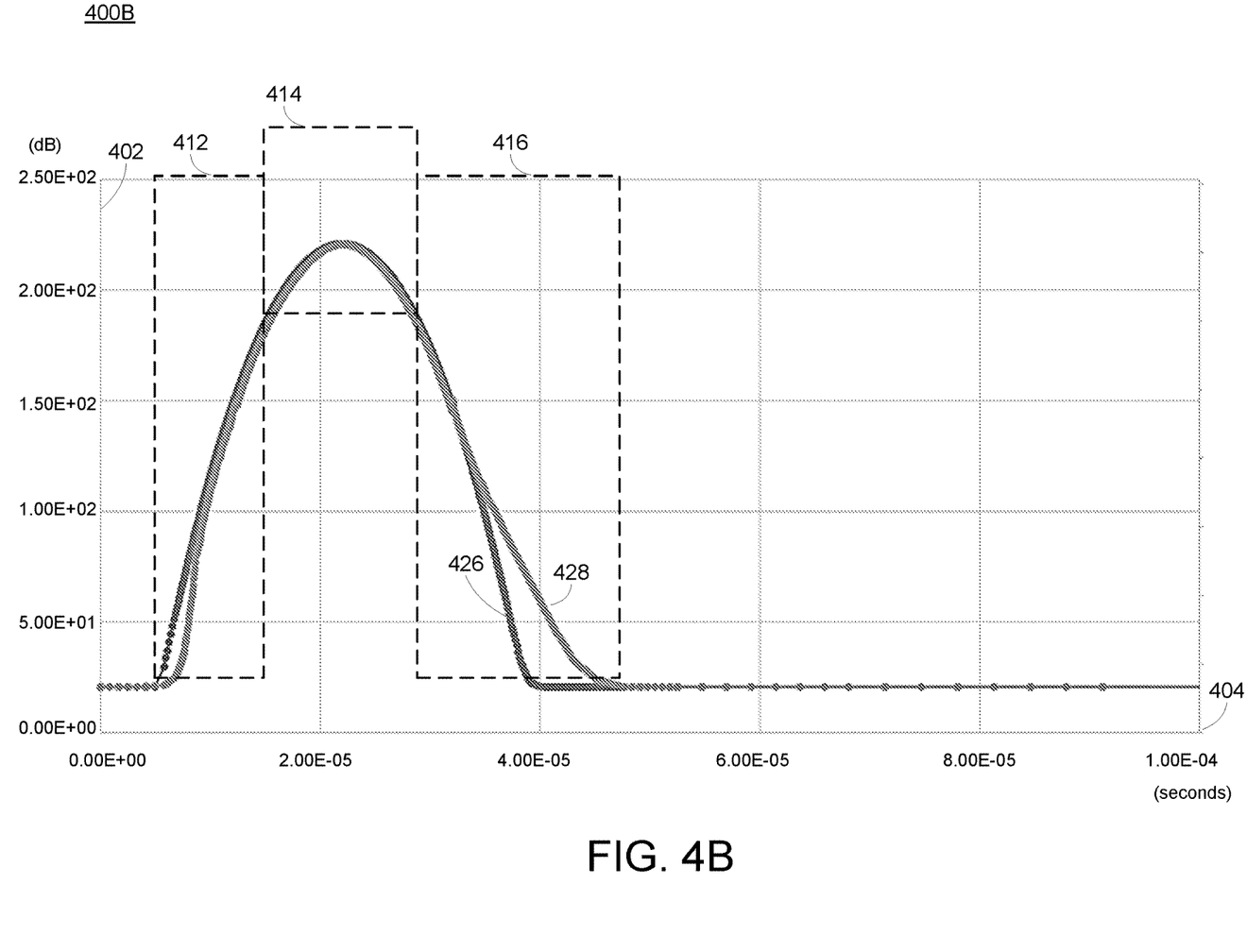

FIGS. 4A-4B illustrate graphs 400A and 400B representing input and output signals of a linear amplifier, a logarithmic amplifier, and a combination of thereof, according to an example. Graph 400A in FIG. 4A shows input signal 406 (photocurrent signal), linear amplifier (implemented as operational amplifier) output 410, and logarithmic amplifier output 408 across time axis 404 (seconds) and power level axis 402 (dB). A first and second power threshold 418 and 419 divide the measurement into three regions 412, 414, and 416.

As shown in graph 400A, the input signal 406 increases with time reaching a peak (approximately centered in region 414) and then decreases with time. The linear amplifier output 410 (e.g., an output of an operational amplifier) may follow the shape of the input signal 406 relatively closely in regions 412 and 416. However, because of the dynamic range limitation of the operational amplifier circuits, the amplification in region 414 may reach saturation and the linear amplifier output 410 may not follow the input signal 406. The logarithmic amplifier output 408, on the other hand, may follow the input signal 406 closely (faithful amplification) in region 414 due to high dynamic range of logarithmic amplifier circuits. However, logarithmic amplifier circuits may have a slower response compared to linear amplifier circuits, thus a more limited bandwidth. Therefore, the logarithmic amplifier output 408 may lag compared to the input signal 406 in region 412. The degradation (lag) in the logarithmic amplifier output 408 may be even larger in region 416.

Accordingly, a dual-amplification circuit for optical measurement instrumentation may include a first amplification path with the first logarithmic amplifier circuit 114 and a second amplification path with the operational amplifier circuit 112 and the second logarithmic amplifier circuit 116 (coupled in series). In some examples, two power thresholds may be set for switching between the two amplification paths. As the input signal 406 increases, a first power threshold 418 may be set about a point where the operational amplifier circuit 112 goes into saturation. In region 412 prior to the first power threshold 418, the second amplification path including the operational amplifier circuit 112 and the second logarithmic amplifier circuit 116 may be used. A response of the second amplification path is shown in graph 400B and discussed below in conjunction with FIG. 4B. Past the first power threshold 418, in region 414, the first amplification path including the first logarithmic amplifier circuit 114 may be selected. Thus, the amplified output may follow a shape of the input signal 406 closely in both regions 412 and 414.

In some examples, as the input signal 406 decreases (beyond the peak) and drops below the saturation point of the operational amplifier circuit 112, a second power threshold 419 may be set and the second amplification path selected again past the second power threshold 419 in region 416. While the second amplification path may not amplify the input signal 406 in region 416 as faithfully as in region 412, the shape of the output signal is still better than the first amplification path. Thus, an overall faithful amplification with the much higher dynamic range of the logarithmic amplifiers may be achieved through the selection of the different amplification paths based on the first power threshold 418 and the second power threshold 419.

In an implementation example configuration, whose performance is shown in graphs 400A, the input signal may start at about −1.6 dB and peak at about 1.6 dB. The operational amplifier circuit 112 may reach saturation at about 0.9 dB and drop out of saturation at about the same power level. Thus, the first power threshold 418 and the second power threshold 419 may be set at 0.9 dB. While the first power threshold 418 and the second power threshold 419 may be set at different power levels depending on the linear amplifier circuit characteristics, the thresholds may also be set to the same value in some implementations.

Graph 400B in FIG. 4B shows input signal 426, which is similar to the input signal 406 in Graph 400A, compared to a combined output signal 428, which results from selection of the dual-amplification outputs as discussed herein, across time axis 404 (seconds) and power level axis 402 (dB). As shown in the graph 400B, the selection of the second amplification path in region 412 as the input signal 426 increases up to the first power threshold 418 and again in region 416 as the input signal 426 decreases from the second power threshold 419, and the first amplification path in region 414 between the two power thresholds provides the combined output signal 428. Through fast switching between the first and second amplification paths, the combined output signal 428 is continuous and follows the shape of the input signal 426 through the entire dynamic range. While the combined output signal 428 has a small lag at lower power levels as the input signal decreases (region 416), it generally follows a shape of the input signal 426 closely at high and low power levels providing sufficient dynamic range and bandwidth for photocurrent signal from a photodiode.

Figure 5:
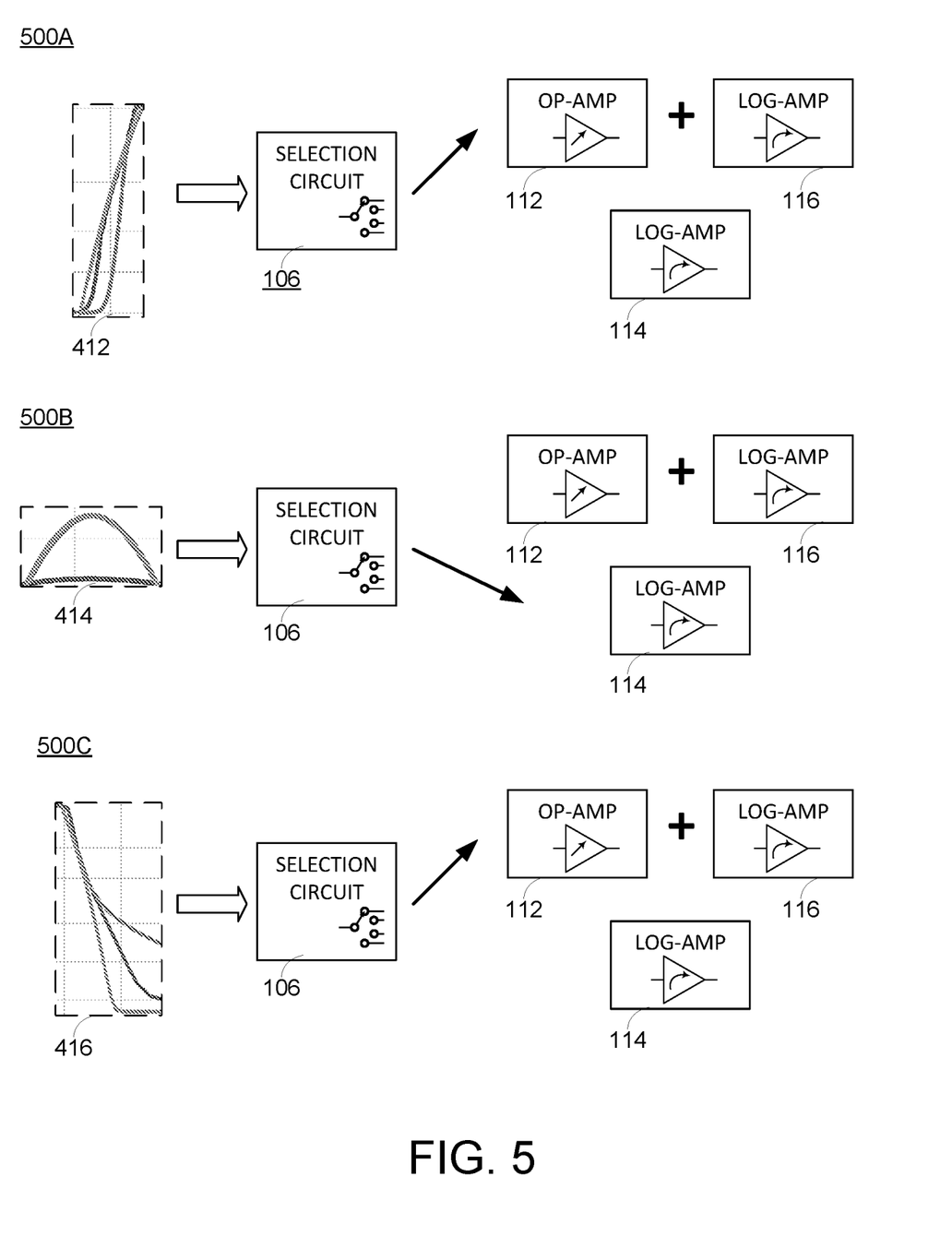
FIG. 5 illustrates a diagram illustrating selection of different amplifier configurations based on a power threshold, according to an example.

FIG. 5 illustrates a conceptual diagram illustrating selection of different amplifier configurations based on a power threshold, according to an example. The conceptual diagram in FIG. 5 includes illustrations of three amplification scenarios. In a first scenario 500A, the input signal (photocurrent signal) is in region 412, where a power level of the input signal has not reached a power threshold for the operational amplifier circuit 112 to enter saturation. Accordingly, the selection circuit 106 may select the first amplification path including the operational amplifier circuit 112 and logarithmic amplifier circuit 116, where the output signal closely follows the input signal.

In some examples, as shown in second scenario 500B, the input signal (photocurrent signal) is in region 414, where the operational amplifier circuit 112 may enter saturation and its output may substantially differ from the input signal. Accordingly, the selection circuit 106 may select the second amplification path including the logarithmic amplifier circuit 114, whose output may very closely follow the input signal providing faithful amplification at high power levels.

In some examples, as shown in third scenario 500C, the input signal (photocurrent signal) is in region 416, where the input signal may drop below the power level threshold, where the operational amplifier circuit 112 is in saturation. Accordingly, the selection circuit 106 may select the first amplification path including operational amplifier circuit 112 and the logarithmic amplifier circuit 114, whose combined output may follow the input signal relatively closely.

Accordingly, the selection of different amplification paths for different power levels of the input signal may provide faithful amplification of the photocurrent input signal at low- and high-power levels allowing a high dynamic range amplifier with sufficient bandwidth for optical input signals.

Figure 6:
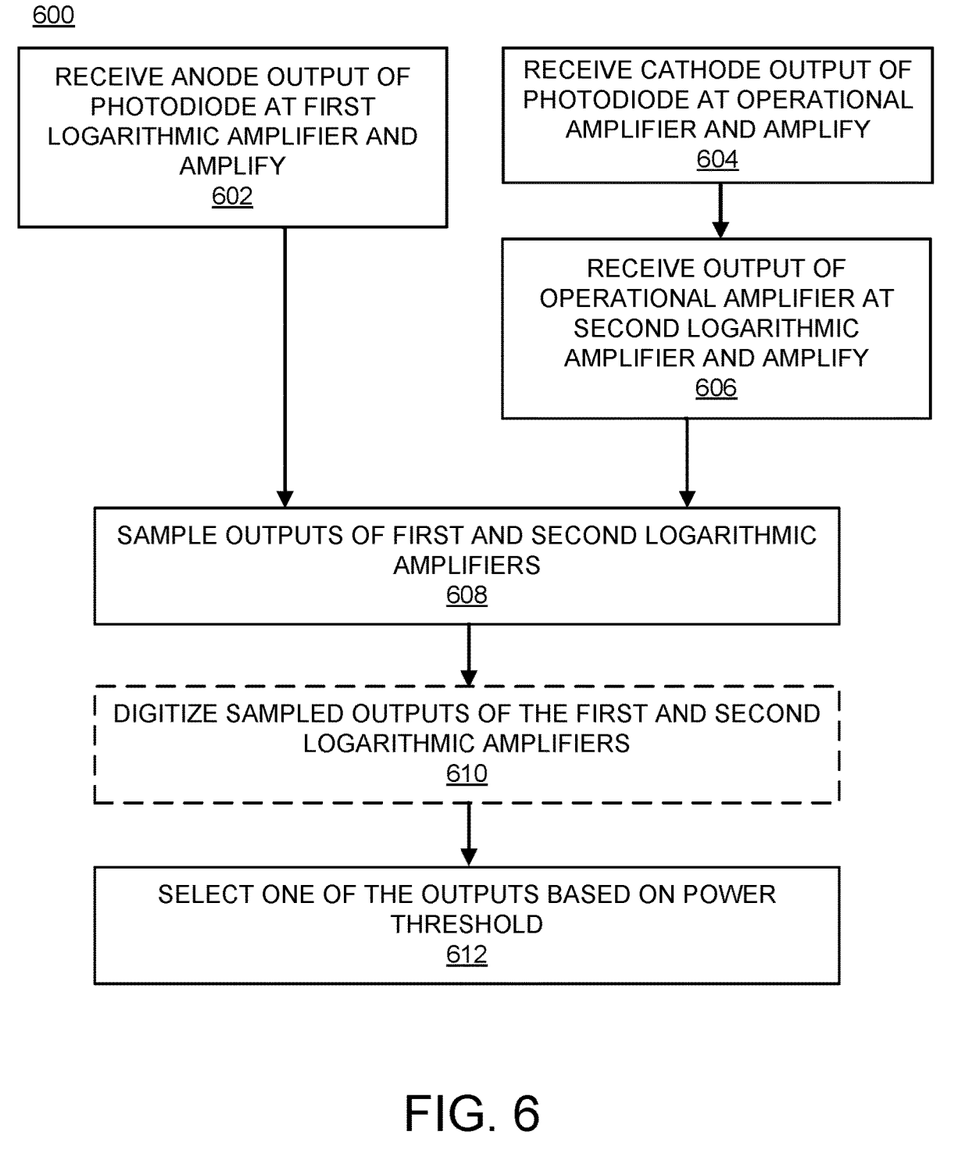
FIG. 6 illustrates a flow chart of a method for employing a combination of linear and logarithmic amplifiers to amplify optical signals, according to an example.

FIG. 6 illustrates a flow chart of a method for employing a combination of linear and logarithmic amplifiers to amplify optical signals, according to an example. The method 600 is provided by way of example, as there may be a variety of ways to carry out the method described herein. Although the method 600 is primarily described as being performed by the circuits of FIGS. 1 and 2, the method 600 may be executed or otherwise performed by one or more processing components of another system or a combination of systems. Each block shown in FIG. 6 may further represent one or more processes, methods, or subroutines, and one or more of the blocks (e.g., the selection process) may include machine readable instructions stored on a non-transitory computer readable medium and executed by a processor or other type of processing circuit to perform one or more operations described herein.

At block 602 an anode output of the photodiode 102 may be received at the first logarithmic amplifier circuit 114 and amplified by the first logarithmic amplifier circuit 114. The first logarithmic amplifier 114 may be referred to as the first amplification path. As discussed herein, the output of the logarithmic amplifier circuit 114 may not follow the input signal closely at lower power levels of the input signal but perform faithful amplification for higher power levels.

In a parallel process, at block 604, a cathode output of the photodiode 102 may be received at the operational amplifier circuit 112 and amplified by the operational amplifier circuit 112. An output of the operational amplifier circuit 112 may be received by the second logarithmic amplifier circuit 116 at block 606 and further amplified. The operational amplifier circuit 112 and the second logarithmic amplifier circuit 116 may be referred to as the second amplification path.

The outputs of the first and second amplification paths from parallel processes or block 602 and blocks 604, 606 may be sampled by the sampling circuit 104 at block 608. At optional block 610, the sampled outputs of both amplification paths may be digitized and provided to the selection circuit 106. In some examples, the outputs may be provided to the selection circuit in analog form without the analog-digital conversion. The selection circuit 106 may be a field programmable gate array (FPGA) or similar digital processing circuit.

At block 612, the selection circuit 106 may select one of the outputs for forwarding to operational circuits or devices of an optical measurement system based on a power level of the input signal. As discussed herein, the first amplification path including the first logarithmic amplifier circuit 114 may be used at higher power levels, and the second amplification path including the operational amplifier circuit 112 and the second logarithmic amplifier circuit 116 may be used at lower power levels.

According to some examples, an optical amplification system may include a first amplification path including a first logarithmic amplifier circuit to receive an input signal; a second amplification path including a linear amplifier circuit and a second logarithmic amplifier circuit coupled in series with the linear amplifier circuit, where the linear amplifier circuit may receive the input signal; and a selection circuit. The selection circuit may select an output of the second amplification path while the input signal is increasing and below a first power threshold; select an output of the first amplification path while the input signal is between the first power threshold and a second power threshold; select the output of the second amplification path again while the input signal is decreasing and below the second power threshold; and provide the selected outputs to a measurement circuit or device.

According to some examples, the optical amplification system may further include a sampling circuit, which may receive an output of the first logarithmic amplifier circuit and an output of the second logarithmic amplifier circuit; and sample the output of the first logarithmic amplifier circuit and the output of the second logarithmic amplifier circuit. The optical amplification system may also include an analog-digital conversion circuit, which may receive the sampled output of the first logarithmic amplifier circuit and the sampled output of the second logarithmic amplifier circuit; convert the sampled output of the first logarithmic amplifier circuit and the sampled output of the second logarithmic amplifier circuit to a first digital signal and a second digital signal; and provide the first digital signal and the second digital signal to the selection circuit.

According to some examples, the linear amplifier circuit may be an operational amplifier circuit. The first logarithmic amplifier circuit may receive the input signal from an anode output of a photodiode, and the linear amplifier circuit may receive the input signal from a cathode output of the photodiode. The measurement circuit or device may be an optical spectrum analyzer (OSA), an optical power meter, or a fiberoptic monitoring system. The first amplification path and the second amplification path may amplify the input signal in parallel. The first power threshold and the second power threshold may be selected based, at least in part, on a saturation level of the linear amplifier circuit.

According to some examples, a method for providing a dual-path amplification of optical input signals for optical measurements may include receiving, from a photodiode, an input signal at an input of a first logarithmic amplifier circuit in a first amplification path; and receiving, from the photodiode, the input signal at an input of a linear amplifier circuit in a second amplification path, where the linear amplifier circuit is coupled in series with a second logarithmic amplifier circuit in the second amplification path. The method may also include selecting, using a selection circuit, an output of the second amplification path while the input signal is increasing and below a first power threshold, an output of the first amplification path while the input signal is between the first power threshold and a second power threshold, and the output of the second amplification path again while the input signal is decreasing and below the second power threshold; and providing the selected outputs to a measurement circuit or device.

According to some examples, the method may further include receiving, at a sampling circuit, an output of the first logarithmic amplifier circuit and an output of the second logarithmic amplifier circuit; and sampling, using the sampling circuit, the output of the first logarithmic amplifier circuit and the output of the second logarithmic amplifier circuit. The method may also include receiving, at an analog-digital conversion circuit, the sampled output of the first logarithmic amplifier circuit and the sampled output of the second logarithmic amplifier circuit; converting, at the analog-digital conversion circuit, the sampled output of the first logarithmic amplifier circuit and the sampled output of the second logarithmic amplifier circuit to a first digital signal and a second digital signal; and providing the first digital signal and the second digital signal to the selection circuit.

According to some examples, receiving the input signal at the input of the first logarithmic amplifier may include receiving the input signal from an anode output of the photodiode; and receiving the input signal at the input of the linear amplifier circuit may include receiving the input signal from a cathode output of the photodiode. The method may further include amplifying the input signal in the first amplification path and in the second amplification path in parallel. The method may also include selecting the first power threshold and the second power threshold based, at least in part, on a saturation level of the linear amplifier circuit. The linear amplifier circuit may be an operational amplifier circuit.

According to some examples, an optical measurement system may include a photodiode to detect an optical signal and, responsive to the detected optical signal, provide a photocurrent signal; and an amplification block to amplify the photocurrent signal. The amplification block may include a first amplification path including a first logarithmic amplifier circuit to receive the photocurrent signal; and a second amplification path including a linear amplifier circuit and a second logarithmic amplifier circuit coupled in series with the linear amplifier circuit, where the linear amplifier circuit may receive the photocurrent signal. The optical measurement system may also include a sampling circuit, which may receive an output of the first logarithmic amplifier circuit and an output of the second logarithmic amplifier circuit; and sample the output of the first logarithmic amplifier circuit and the output of the second logarithmic amplifier circuit. The optical measurement system may further include a selection circuit, which may select one of the sampled output of the first logarithmic amplifier circuit and the sampled output of the second logarithmic amplifier circuit based, at least in part, on a power level of the photocurrent signal; and provide the selected output to a measurement circuit or device of the optical measurement system.

According to some examples, the optical measurement system may further include an analog-digital conversion circuit, which may receive the sampled output of the first logarithmic amplifier circuit and the sampled output of the second logarithmic amplifier circuit; convert the sampled output of the first logarithmic amplifier circuit and the sampled output of the second logarithmic amplifier circuit to a first digital signal and a second digital signal; and provide the first digital signal and the second digital signal to the selection circuit. The first logarithmic amplifier circuit may receive the photocurrent signal from an anode output of the photodiode; and the linear amplifier circuit may receive the photocurrent signal from a cathode output of the photodiode. The selection circuit may compare the power level of the photocurrent signal to a saturation level of the linear amplifier circuit.

It should be appreciated that while examples are described with two amplification paths, one with a logarithmic amplifier circuit only, one with an operational amplifier and a logarithmic amplifier, other implementations may also include different configurations. For example, multiple amplifier circuits may be used in one or both amplification paths. Each amplifier circuit may be configured (e.g., gain, bandwidth, etc.) according to specific device configuration or expected input signal levels. Furthermore, the amplification block described herein may be employed to amplify signals other than optical signals (photocurrent signal) as well.

While examples described herein are directed to configurations as shown, it should be appreciated that any of the components described or mentioned herein may be altered, changed, replaced, or modified, in size, shape, and numbers, or material, depending on application or use case, and adjusted for desired resolution or optimal measurement results.

It should be appreciated that the apparatuses, systems, and methods described herein may minimize, reduce, and/or eliminate amplification degradation in form of dynamic range and/or bandwidth, and thereby facilitate more reliable and accurate optical measurements, specifically for low power level input signals. It should also be appreciated that the apparatuses, systems, and methods, as described herein, may also include, or communicate with other components not shown. For example, these may include external processors, counters, analyzers, computing devices, and other measuring devices or systems. This may also include middleware (not shown) as well. The middleware may include software hosted by one or more servers or devices. Furthermore, it should be appreciated that some of the middleware or servers may or may not be needed to achieve functionality. Other types of servers, middleware, systems, platforms, and applications not shown may also be provided at the backend to facilitate the features and functionalities of the testing and measurement system.

Moreover, single components may be provided as multiple components, and vice versa, to perform the functions and features described herein. It should be appreciated that the components of the system described herein may operate in partial or full capacity, or it may be removed entirely. It should also be appreciated that analytics and processing techniques described herein with respect to the optical measurements, for example, may also be performed partially or in full by other various components of the overall system.

It should be appreciated that data stores may also be provided to the apparatuses, systems, and methods described herein, and may include volatile and/or nonvolatile data storage that may store data and software or firmware including machine-readable instructions. The software or firmware may include subroutines or applications that perform the functions of the measurement system and/or run one or more application that utilize data from the measurement or other communicatively coupled system.

The various components, circuits, elements, components, and interfaces, may be any number of mechanical, electrical, hardware, network, or software components, circuits, elements, and interfaces that serves to facilitate communication, exchange, and analysis data between any number of or combination of equipment, protocol layers, or applications. For example, the components described herein may each include a network or communication interface to communicate with other servers, devices, components or network elements via a network or other communication protocol.

Although examples are directed to test and measurement systems, such as optical spectrum analyzers (OSAs), it should be appreciated that the systems and methods described herein may also be used in other various systems and other implementations. For example, these may include various test, monitoring, and measurement systems. In fact, there may be numerous applications in optical communication networks and fiber sensor systems that could employ the systems and methods as well.

What has been described and illustrated herein are examples of the disclosure along with some variations. The terms, descriptions, and figures used herein are set forth by way of illustration only and are not meant as limitations. Many variations are possible within the scope of the disclosure, which is intended to be defined by the following claims—and their equivalents—in which all terms are meant in their broadest reasonable sense unless otherwise indicated.

The invention claimed is:

1. An optical amplification system, comprising:
    a first amplification path comprising only a first logarithmic amplifier circuit to receive an input signal;
    a second amplification path comprising a linear amplifier circuit and a second logarithmic amplifier circuit coupled in series with the linear amplifier circuit, wherein the second amplification path is to receive the input signal; and
    a selection circuit to:
        select an output of the second amplification path while the input signal is increasing and below a first power threshold, wherein the first power threshold is selected based on a beginning of a saturation level of the linear amplifier circuit;
        select an output of the first amplification path while the input signal is increasing above the first power threshold to reach a peak and is decreasing after the peak and above a second power threshold, wherein the second power threshold is selected based on an ending of the saturation level of the linear amplifier circuit, and wherein the first power threshold is different from the second power threshold;
        select the output of the second amplification path again while the input signal is decreasing and below the second power threshold; and
        provide the selected outputs to a measurement device.

2. The optical amplification system of claim 1, further comprising:
    a sampling circuit to:
        receive the output of the first amplification path and the output of the second amplification path; and
        sample the output of the first amplification path and the output of the second amplification path.

3. The optical amplification system of claim 2, further comprising:
    an analog-digital conversion circuit to:
        receive the sampled output of the first amplification path and the sampled output of the second amplification path;
        convert the sampled output of the first amplification path and the sampled output of the second amplification path to a first digital signal and a second digital signal, respectively; and
        provide the first digital signal and the second digital signal to the selection circuit.

4. The optical amplification system of claim 1, wherein the linear amplifier circuit is an operational amplifier circuit.

5. The optical amplification system of claim 1, wherein the first amplification path is to receive the input signal from an anode output of a photodiode.

6. The optical amplification system of claim 5, wherein the second amplification path is to receive the input signal from a cathode output of the photodiode.

7. The optical amplification system of claim 1, wherein the measurement device is one of an optical spectrum analyzer (OSA), an optical power meter, or a fiberoptic monitoring system.

8. The optical amplification system of claim 1, wherein the first amplification path and the second amplification path are to amplify the input signal in parallel.

9. The optical amplification system of claim 1, wherein the selection circuit is to:
    set the first power threshold at a point where the linear amplifier circuit enters the saturation level, and
    set the second power threshold at a point where the linear amplifier circuit leaves the saturation level.

10. A method for providing a dual-path amplification of an optical input signal for optical measurements, the method comprising:

receiving, from a photodiode, the optical input signal at an input of a first amplification path, wherein the first amplification path comprises only a first logarithmic amplifier;

receiving, from the photodiode, the optical input signal at an input of a second amplification path, wherein the second amplification path comprises a linear amplifier circuit coupled in series with a second logarithmic amplifier circuit;

selecting, using a selection circuit,
- an output of the second amplification path while the optical input signal is increasing and below a first power threshold, wherein the first power threshold is selected based on a beginning of a saturation level of the linear amplifier circuit,
- an output of the first amplification path while the optical input signal is increasing above the first power threshold to reach a peak and is decreasing after the peak and above a second power threshold, wherein the second power threshold is selected based on an ending of the saturation level of the linear amplifier circuit, and wherein the first power threshold is different from the second power threshold, and
- the output of the second amplification path again while the optical input signal is decreasing and below the second power threshold; and providing, by the selection circuit, the selected outputs to a measurement device.

11. The method of claim 10, further comprising:
receiving, at a sampling circuit, the output of the first amplification path and the output of the second amplification path; and
sampling, using the sampling circuit, the output of the first amplification path and the output of the second amplification path.

12. The method of claim 11, further comprising:
receiving, at an analog-digital conversion circuit, the sampled output of the first amplification path and the sampled output of the second amplification path;
converting, by the analog-digital conversion circuit, the sampled output of the first amplification path and the sampled output of the second amplification path to a first digital signal and a second digital signal, respectively; and
providing the first digital signal and the second digital signal to the selection circuit.

13. The method of claim 10, wherein
receiving the optical input signal at the input of the first amplification path comprises receiving the optical input signal from an anode output of the photodiode; and
receiving the optical input signal at the input of the second amplification path comprises receiving the optical input signal from a cathode output of the photodiode.

14. The method of claim 10, further comprising:
amplifying the optical input signal in the first amplification path and in the second amplification path in parallel.

15. The method of claim 10, further comprising:
setting the first power threshold at a point where the linear amplifier circuit enters the saturation level, and
setting the second power threshold at a point where the linear amplifier circuit leaves the saturation level.

16. The method of claim 10, wherein the linear amplifier circuit is an operational amplifier circuit.

17. An optical measurement system, comprising:
a photodiode to detect an optical signal and, responsive to the detected optical signal, provide a photocurrent signal;
an amplification block to amplify the photocurrent signal, the amplification block comprising:
- a first amplification path comprising only a first logarithmic amplifier circuit to receive the photocurrent signal; and
- a second amplification path comprising a linear amplifier circuit and a second logarithmic amplifier circuit coupled in series with the linear amplifier circuit, wherein the linear amplifier circuit is to receive the photocurrent signal;

a sampling circuit to:
- receive an output of the first amplification path and an output of the second amplification path; and
- sample the output of the first amplification path and the output of the second amplification path; and a selection circuit to:
- select the sampled output of the second amplification path while the photocurrent signal is increasing and below a first power threshold, wherein the first power threshold is selected based on a beginning of a saturation level of the linear amplifier circuit;
- select the sampled output of the first amplification path while the photocurrent signal is increasing above the first power threshold to reach a peak and is decreasing after the peak and above a second power threshold, wherein the second power threshold is selected based on an ending of the saturation level of the linear amplifier circuit;
- select the sampled output of the second amplification path again while the photocurrent signal is decreasing and below the second power threshold; and
- provide the selected sampled outputs to a measurement device of the optical measurement system.

18. The optical measurement system of claim 17, further comprising:
an analog-digital conversion circuit to:
- receive the sampled output of the first amplification path and the sampled output of the second amplification path;
- convert the sampled output of the first amplification path and the sampled output of the second amplification path to a first digital signal and a second digital signal, respectively; and
- provide the first digital signal and the second digital signal to the selection circuit.

19. The optical measurement system of claim 17, wherein
the first amplification path is to receive the photocurrent signal from an anode output of the photodiode; and
the second amplification path is to receive the photocurrent signal from a cathode output of the photodiode.

20. The optical measurement system of claim 17, wherein the selection circuit is to:
set the first power threshold at a point where the linear amplifier circuit enters the saturation level, and
set the second power threshold at a point where the linear amplifier circuit leaves the saturation level.

* * * * *